United States Patent [19]
Callebert et al.

[11] Patent Number: 5,376,413
[45] Date of Patent: Dec. 27, 1994

[54] TREATMENT OF TEXTILE FIBERS

[75] Inventors: Franck Callebert, Lille; Christian Dupret, La Madeleine; Odile Dessaux; Pierre Goudmand, both of Lille, all of France

[73] Assignee: Sommer Societe Anonyme, Nanterre Cedex, France

[21] Appl. No.: 969,251

[22] PCT Filed: Jul. 31, 1991

[86] PCT No.: PCT/EP91/01488
§ 371 Date: Feb. 19, 1993
§ 102(e) Date: Feb. 19, 1993

[87] PCT Pub. No.: WO92/03591
PCT Pub. Date: Mar. 5, 1992

[30] Foreign Application Priority Data
Aug. 22, 1990 [EP] European Pat. Off. ............ 90870131

[51] Int. Cl.⁵ ............................................. B05D 3/06
[52] U.S. Cl. .................... 427/489; 427/221; 427/222; 427/255.6; 427/488; 427/491; 427/535; 427/536; 427/569; 427/575; 427/578
[58] Field of Search .............. 427/488, 489, 491, 535, 427/536, 569, 578, 575, 221, 222, 255.6

*Primary Examiner*—Bernard Pianalto
*Attorney, Agent, or Firm*—Chilton, Alix & Van Kirk

[57] ABSTRACT

A process for forming a coating on a surface of a textile fiber, comprising subjecting the fiber surface to first and second process phases while passing the fiber through a reaction medium comprising a cold flowing plasma containing an active species, the first phase including treating the fiber surface in order to increase its adhesive properties, and the second phase including introducing a polymerizable material comprising at least one of a prepolymer and a monomer into the cold flowing plasma in the presence of the fiber under conditions sufficient to induce the formation of a polymerized coating on the fiber surface, polymerization being induced by the active species.

20 Claims, 5 Drawing Sheets

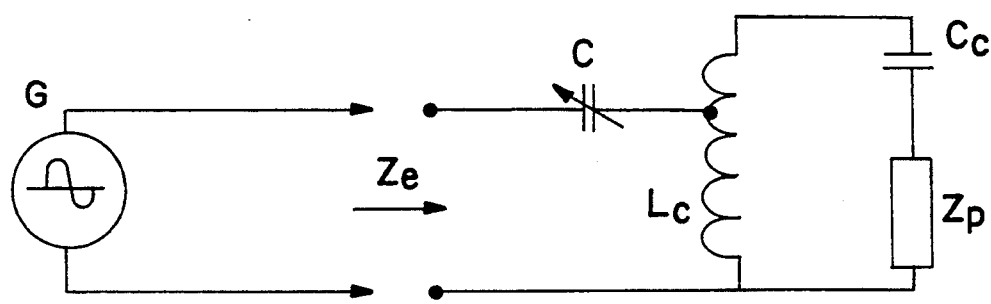
F I G. 6

TREATMENT OF TEXTILE FIBERS

SUBJECT OF THE INVENTION

The present invention relates to the surface treatment of textile fibers by deposition of a film obtained by polymerization which makes it possible to impart to the fibers in particular antisoiling and antiwettability properties.

The present invention also relates to the device for implementing the process.

The present invention finally relates to the products obtained by the process, in particular fibers coated with a coating film obtained by polymerization.

DESCRIPTION OF THE PRIOR ART

The techniques of textile processing have assumed an essential role in the finishing operations in the industry of coverings for floors and/or walls. In particular, these techniques make it possible to obtain advantageous final properties such as anti-wettability or antisoiling.

It is known to finish textile coverings by using sprays of fluorinated resin which make it possible to "sheathe" the fibers making up the textile covering by deposition of resin, thus imparting to them an antiwettability character.

Nevertheless, this method does not give very satisfactory results. In fact, this spray deposition generates a heterogeneous treatment on the surface of the fibers.

Moreover, this type of coating has a poor resistance to the wear produced by traffic and therefore has a tendency to form cracks, thus making it possible for the agents responsible for stains to infiltrate between the resin layer and the fiber, thus rendering it impossible to remove stains from the covering.

The use of synthetic tannins (soil release) as an improving technique is also known, but it involves processes which are particularly cumbersome to use.

It has been proposed in the document EP-A-0 068 775 (TORAY INDUSTRIES) to improve the dyeing properties of a fabric by causing external irregularities (craters) of the surface fibers using a cold plasma. This document does not involve the use of a monomer and does not cause improvement in the properties targeted by the present invention.

A technique for producing layers of semiconductors on a substrate using a delocalized discharge (remote plasma) technique is known from the document U.S. Pat. No. 4,870,030 (MARKUNAS).

The process involves no polymerization of a monomer but relates to deposition of thin films using nonorganic precursors. The generator used is a 13.56 MHz RF (radio-frequency) generator and the process is non-continuous.

The Remote Plasma Enhanced Chemical Vapor Deposition (RPECVD) technique for the deposition of metal films (tungsten, silicon, etc.) is described in IEEE ELECTRON DEVICE LETTERS, Vol. EDL-8, No. 9, September 1987, pp. 421–424, New York, U.S.; M. M. MOSLEHI et al.: "Formation of MOS gates by rapid thermal/microwave remote-plasma multiprocessing".

The deposition is assisted by intense illumination with a tungsten (UV) lamp and by substantial heating of the substrate (450° to 1150° C.). It does not apply to polymerization.

The use of discharge plasmas for polymerization has furthermore been described in H. V. Boenig, Fundamentals in plasma chemistry and technology, technomic pub. Co. Lancaster-Basel (1988); H. Yasuda, Plasma polymerization, Academic Press, N.Y. (1985); G. Akovali and N. Dilsiz, Polymer Eng. Sci., 30., 485, (1990).

None of these documents solves the basic problem of the invention which consists in imparting antisoiling or anti-wettability properties to fibers.

None proposes any solution for transposing to the industrial scale a process which would allow fibers to be treated at a sufficient speed from an economic point of view.

In fact, for a technique to be economically satisfactory, the lifetime of the active (excited) species and the volume which they occupy must be sufficient in order to allow the action of a treatment agent such as a monomer or a prepolymer at sufficiently high speeds. It is furthermore advisable to avoid destruction of the fibers or of the deposit formed by polymerization of the monomer.

AIMS OF THE INVENTION

The present invention aims to provide a process which allows the deposition of coating films by surface treatment of textile fibers in order to impart to them particular properties, in particular antisoiling properties, while avoiding the drawbacks of the prior art.

Another aim is to provide a process which may be applied on an industrial scale.

An additional aim of the present invention is to make a homogeneous deposit on the surface of the fibers.

The present invention also aims to provide a device for implementing the process, in particular it aims to provide a device for continuous treatment of yarns consisting of textile fibers.

Other aims and advantages will emerge in the description which follows.

CHARACTERISTIC ELEMENTS OF THE INVENTION

The process according to the present invention consists in treating the surface of a textile fiber by reaction of a monomer or prepolymer which can take place in a polymerization process thus forming a sheathing adhering to the surface of the fiber, this polymerization being induced by passing the fiber through a reaction medium consisting of cold flowing plasma and of monomer and/or of prepolymer.

Prior to polymerization, the fiber undergoes, according to a preferred embodiment, a treatment by cold flowing plasma with a view to increasing its adhesion properties.

The flowing plasma is obtained by discharge in a plasma-producing gas, preferably in nitrogen which is possibly doped, in a device called a coupler constituting a microwave resonant cavity and connected to a microwave generator. The frequencies of the microwave discharge are preferably 433 MHz, 915 MHz, 2450 MHz or any other industrial frequency.

This resonant cavity has a central tube through which there passes the glass tube which conveys the plasma-producing gas and which has a gap (opening) in which a high electric field necessary for the discharge is located.

The plasma-producing gas is preferably a nitrogen gas ($N_2$) which is possibly doped but other gases (Ar, Xe, NO or $O_2$) may be used.

The presence of oxygen and/or of water vapor in the plasma acting as a polymerization cofactor in the presence of Ne has proved particularly advantageous. They may be injected upstream of the injection of the monomer or of the prepolymer or simultaneously with the latter.

Dioxygen ($O_2$) is preferably used at flow rates varying from 0.1 to 20% of the flow rate of plasma-producing gas.

The process for treating the surface of a fiber may be performed continuously for a material consisting of textile fibers, preferably in the form of a yarn.

Silicon derivatives and preferably a siloxane or silazane are particularly suitable as the monomer or prepolymer.

The process is applicable to most synthetic, semisynthetic or natural fibers whether treated or not, in particular fibers made of an organic polymer material, preferably polyamide, polypropylene or polyester.

The invention also relates to a device for implementing the process according to the preceding description, comprising a zone of delocalized discharge of a cold flowing plasma, and a reactor supplied with monomers or with prepolymers through which the yarn to be treated successively moves.

Other characteristics and advantages of the invention will emerge on reading the preferred embodiment of the invention which follows.

BRIEF DESCRIPTION OF THE FIGURES

FIG. 6 represents the equivalent electronic circuit diagram of the 433 MHz cavity and of its coupling.

DEFINITIONS

It is appropriate to give a precise definition of a cold plasma and in particular of a cold flowing plasma as compared to thermal plasmas.

A plasma is defined as an ionized gaseous medium which is electrically neutral and therefore contains positive ions, negative ions and electrons such that the algebraic sum of their charges is zero. It furthermore comprises excited atomic or molecular species. It is obtained experimentally by subjecting a pure gas or a gaseous mixture to external excitation which is most generally electrical.

A distinction is made between thermal plasmas and cold plasmas.

Thermal plasmas are obtained at pressures greater than 100 mb, in general, by massive injection of electrical energy (i.e. plasma torch) and are in thermodynamic equilibrium, which is to say that the kinetic energy of each of the particles may be expressed in the form:

$$\epsilon_c = 3/2kT$$

where
 k = Boltzmann's constant
 T = coefficient defining the temperature in the case of thermodynamic equilibrium.

The coefficient T is such that the equilibrium temperature is the same for all the particles. This is also true for the electronic temperature and, in the case of molecules or molecular ions, for the vibrational or rotational temperatures which can be determined by virtue of spectroscopic experiments and which are respectively denoted: $T_{elec}$, $T_v$ and $T_r$.

Two categories of cold plasma may be distinguished:
 a) Cold plasmas proper which are always partiallyionized gases with pressures less than 100 mb. They are obtained in an electrical discharge and the current industrial technique is to use high-frequency (13.56 MHz) or microwave (2450 MHz or 433MHz in France —915 MHz in Great Britain and in the USA) discharges. It should be pointed out that it is possible to observe them in the electrical field and, above all, in dynamic systems in a nonelectrical medium, but in the vicinity thereof.

In practice, these plasmas are obtained in the case of pressures between $10^{-2}$ and 2 mB.

Figure 1:
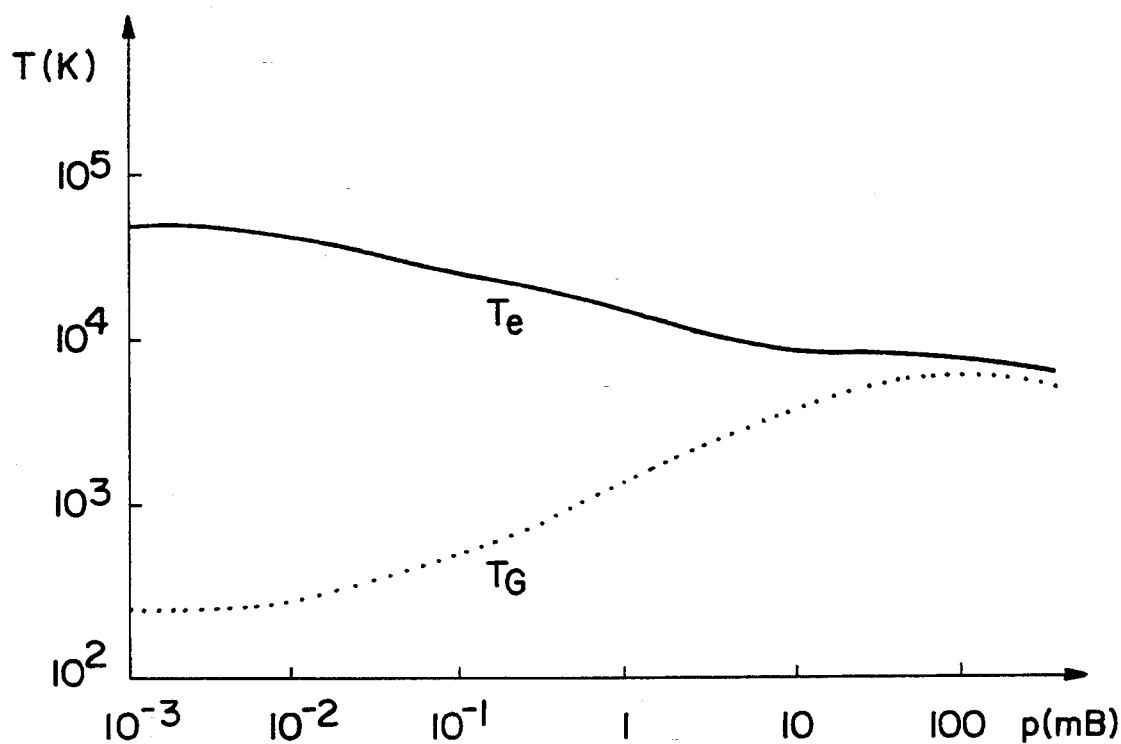
FIG. 1 represents, in the case of cold plasmas, the translational temperatures of the heavy particles and of the electrons, as a function of pressure.

FIG. 1 characterizes, as a function of pressure, the translational temperatures $T_G$ of the heavy particles (atoms, molecules, ions) and $T_e$ of the electrons.

This diagram indicates that, at a low pressure, the temperature of the gas (translation of the heavy particles) remains relatively small: the ambient temperature for $p<10^{-1}$ mb is of the order of 10,000K. and of the order of 1000K. for p=1 mb whereas the temperature, and therefore the kinetic energy, of the electrons is much higher.

b) Cold flowing plasmas

This reactive medium is obtained by extracting the excited atomic or ionic species from the aforementioned plasma after expansion, in the dynamic regime, in a container outside the electric field.

There is, from a linguistic point of view, disagreement over the term plasma, in particular for such a reactive medium was [sic] formerly known by the name "atomic gas", which term is wholly inappropriate except in the case of hydrogen. On the other hand, the word "remote plasma" has appeared in the Anglo-American scientific literature. The precisely correct French term should be post-discharge flowing plasma or more simply delayed plasma.

This reactive medium is characterized in that:
 1) It is obtained, in flow, by extracting the active species from a discharge in a gas comprising molecules. It should be emphasized that this property is not at all general and that a monoatomic gas can give a delayed plasma by formation of excimer molecules accompanying the metastable excited atomic states.
 2) It does not contain ions or electrons in an appreciable quantity and is composed: of free atoms—in general in the ground state, whose reactivity stems from the radical-like character.
 Example:
  H($^2$S) single free radical
  O($^3$P) double free radical
  N($^4$S) triple free radical electronically or vibrationally excited diatomic molecular species with relatively long relaxation time.
Example:
dinitrogen:
$N_2\ ^1\Sigma_v$ vibrationally excited ground state
$N_2\ ^3\Sigma$ first triplet state with double-radical character
dioxygen:
$O_2(^1\Sigma)$ and $O_2(^1\rho)$ chemically reactive metastable states of dioxygen.
3) It is characterized by a significant thermodynamic nonequilibrium which can be quantified in the following manner:

If we call:
$T_g$ the translational temperature of the atoms and molecules which is close to the ambient temperature,
$T_D$ the temperature of dissociation into atoms of the molecule,
$T_v$ the vibrational temperature,
$T_{elec}$ the diatomic molecule electronic excitation temperature,
the values of $T_D$, $T_v$, $T_{elec}$ are very high and are variable according to the system envisaged; they decrease with pressure because of relaxations through collisions.

Figure 2:
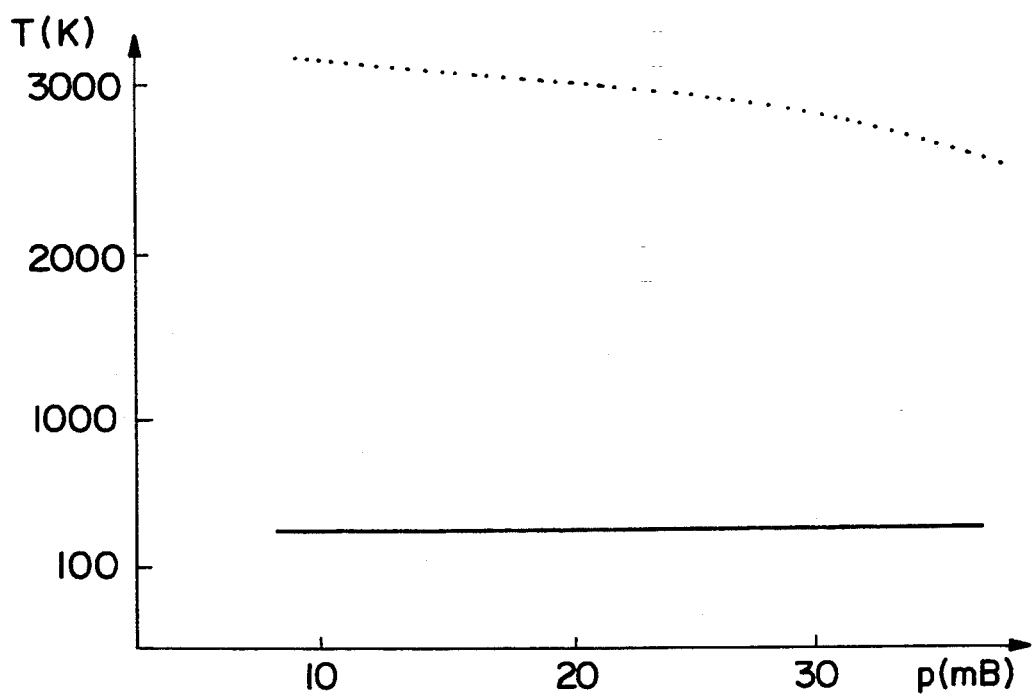
FIG. 2 represents, in the case of a flowing nitrogen plasma, comparative variations in translational and vibrational temperature.

By way of example, the curve represented in FIG. 2 indicates the comparative variations in translational and vibrational temperature for a nitrogen plasma.

Post-discharge plasmas are principally obtained with homonuclear diatomic gases:
$O_2$ (active species: $O(^3P)$, $O_2(^1\rho)$, $O_2(^1\Sigma)$)
$N_2$ (active species: $N(^4S)$, excited $N_2(^1\Sigma)_v$, $N_2(^3\Sigma)$)

It should be noted that the particular mechanistic behavior of nitrogen plasmas allows them to have a "lifetime" and a spread in volume which are much greater than those of for example oxygen. Furthermore, the existence of other plasma-producing gases such as CO, $CO_2$, $NO_2$ etc., which are of interest should also be noted.

Finally, the properties of a plasma may be directed by a doping agent, for example $NF_3$, $CF_4$, the halogen gases and, especially in the case of the nitrogen post-discharge plasma, $NH_3$.

Finally, the nitrogen delayed plasma has a very low viscosity which makes its action possible for any type of geometry.

In summary, it is possible to differentiate between the discharge plasma and the post-discharge plasma in the following manner:
Discharge plasma, primary effect: bombardment by fast electrons. The origin of the experimentally observed oxidations is the action of atomic or molecular oxygen on the free radicals created at the surface of the plastic substrate by the bombardment of electrons.
Working pressure: <1 mb
Viscosity of the plasma: high.
Post-discharge plasma, primary effect: surface radical reactions of free atoms or of excited molecules creating an effect promoting functionalisation of the surface of the substrate.
Working pressure: <50 mb (nitrogen plasma)
Viscosity of the plasma: low
Spread in volume: high (nitrogen plasma).

Description of a preferred embodiment of the invention

The present invention covers two distinct processes. They are preferably successive according to this preferred embodiment:
1) The object of the first process which consists in passing the fiber through a cold flowing nitrogen plasma is to increase the wettability and as a consequence the adhesive properties of the fiber.
2) The second process relates to the creation of a polymer deposit in the form of a coating on the fiber. This polymerization is induced by the active species (radical or other) of the cold flowing nitrogen plasma.

The cold flowing plasma generated at 433 MHz exhibits three regimes:
the regime of discharge localized to the coupler (4),
the delocalized discharge regime (14),
the post-discharge regime (25).

The first process preferably is conducted in the delocalized discharge regime, and the second process preferably is conducted in the post-discharge regime.

Figure 3:
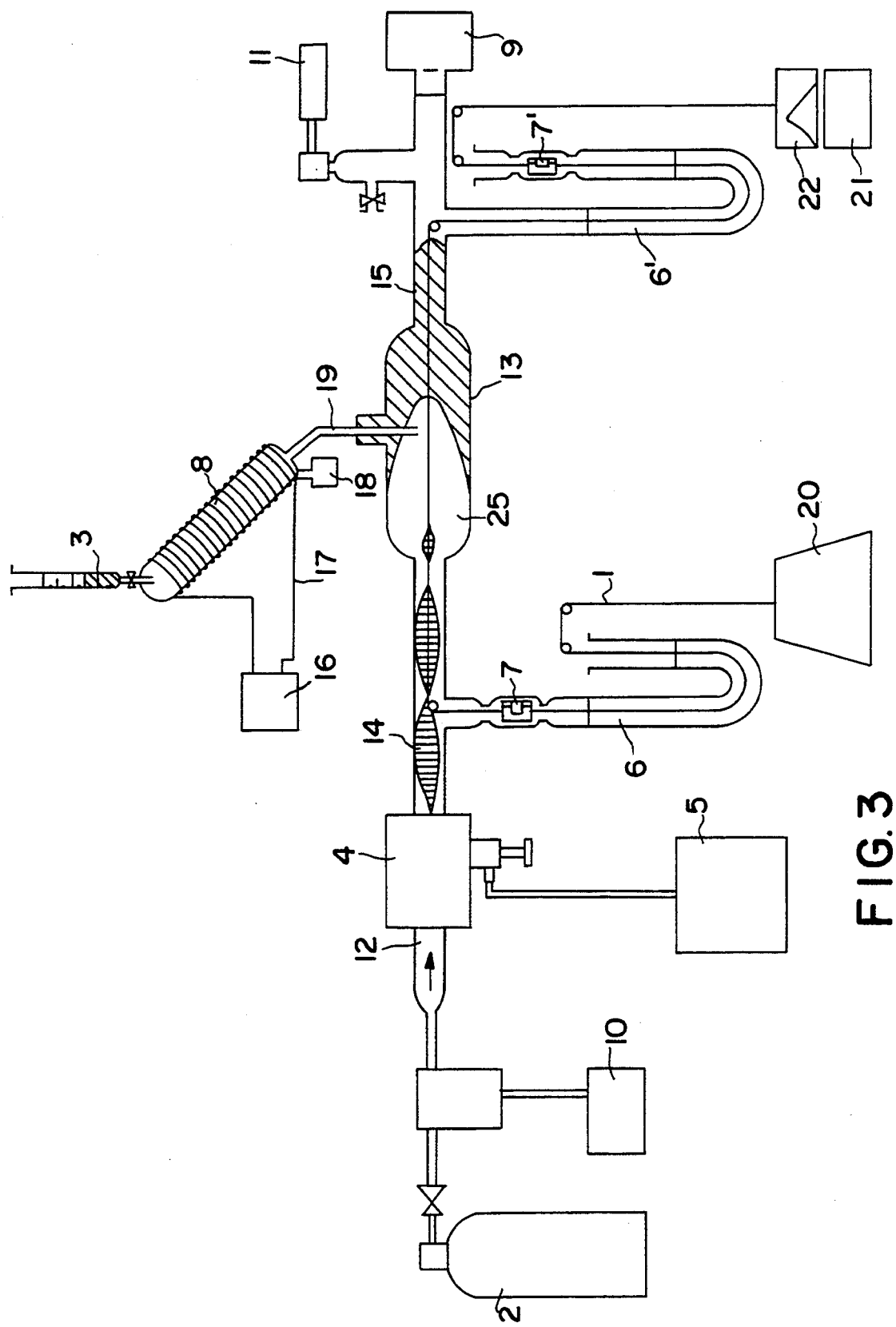
FIG. 3 represents an overall diagrammatic view of the device according to the invention.

A device suitable for implementing the process according to the invention is represented in FIG. 3.

In this device, the process consists in continuously treating a yarn made up of textile fibers, preferably of polyamide.

Fibers made of any other polymer organic material, in particular of polypropylene or polyester, are also suitable for this application.

The yarn 1 is introduced from an entry bobbin 20 into the device kept under partial vacuum by a leaktight seal 6 consisting of a U-shaped mercury column 760 mm high.

The yarn is then wiped clean by a wiping mechanism 7 and brought into the zone of delocalized discharge 14 of a cold flowing plasma.

The plasma-producing gas 2 consists of nitrogen possibly doped with oxygen or with rare gases.

The gas is expanded and sucked using a pump. The flow rate of the gas is adjusted by a flow meter. The plasma-producing gas 2 is thus introduced into a pyrex discharge tube passing through the resonant cavity forming the coupler 4. The discharge is produced by transferring energy provided by the microwave generator 5 to the plasma-producing gas. Zones of delocalized discharge 14 are in this case produced downstream of the cavity.

After passing through these zones of delocalized discharge 14 of a cold flowing plasma in which it undergoes an increase in its adherence properties, the yarn 1 is then brought into the reactor 13.

Monomers or prepolymers in the gaseous state are injected into this reactor 13 via the injection nozzle.

If the monomer or prepolymer is in the liquid state under normal conditions of temperature and pressure, the monomer contained in a tank 3 is heated beforehand in an evaporator 8 surrounded by a heating lead 17, adjusted by a rheostat 16. A condenser 18 may collect the condensed monomer.

The yarn passes into a narrow part 15 of the reactor 13 in which the monomer or prepolymer is polymerized, forming a sheathing adhering to the surface of the yarn 1.

The yarn reemerges through a leaktight seal 6' similar to 6, and a wiping mechanism 7', and is wound on the bobbin 21 by the bobbin winder 22.

A pressure sensor 11 makes it possible to measure the pressure prevailing in the device.

The monomers used are preferably derivatives of silicon, in particular siloxanes of general formula

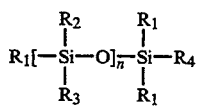

in which

R$_1$ and R$_4$ are aliphatic groups,
R$_2$ is a methyl, hydroxyl, ethyl or carboxyl group,
R$_3$ is a methyl group and
n is between 1 and 40
or alternatively cyclic monomers such as octamethyltetracyclosiloxane [sic]

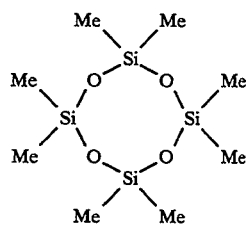

where Me is a methyl radical.

Halogenated and preferably fluorinated organic compounds are also suitable for this treatment.

The polymerization of the monomers which is initiated in the polymerization zone 15 makes it possible to obtain a polymer film constituting an adherent sheathing on the surface of the fibers.

A pressure sensor 11 makes it possible to monitor the pressure, which must be kept at values close to 0.10 mbar.

The yarn 1 passes through a second leaktight system 6 and is wiped clean by a wiping mechanism 7 before being wound on an exit bobbin 22 placed on a bobbin winder 21 which is itself driven by a motor.

Figure 4:
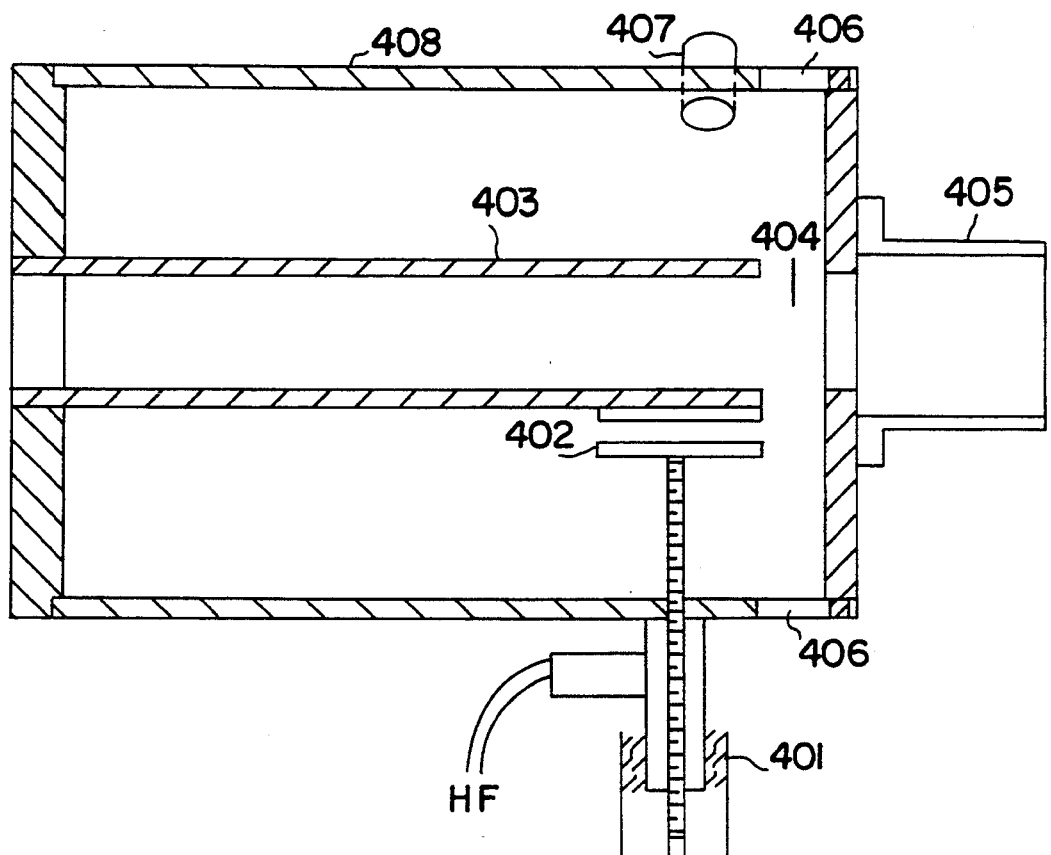
FIG. 4 represents a 433 MHz coupler in longitudinal section.

FIG. 4 represents the 433 MHz coupler in more detail.

Figure 5:
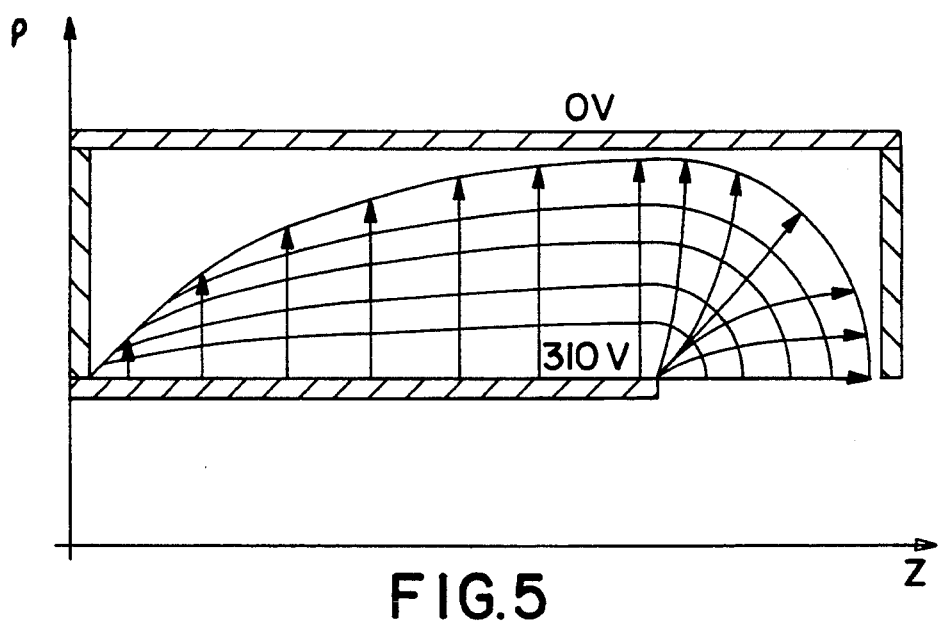
FIG. 5 represents the field lines of a 433 MHz coupler.

The 433MHz resonant cavity constituting the coupler is of the coaxial type and has a central coaxial tube 403 which allows the glass discharge tube conveying the plasma-producing gas to pass through. This central tube 403 has an opening 404 called a "gap" where a strong electric field necessary for the discharge is located. The field lines of the cavity are represented in Figure 5.

The potential of the central tube 403 is 310 V in the case of a maximum power of 400 W and the potential of the external surface 408 of the cavity is at 0 V.

This potential is determined by calculation in the absence of plasma, as a function of the geometry in the case of the maximum power.

The ratio of the radius of the external surface 408 to the radius of the central tube 403 is also chosen so as to obtain a maximum surface current in the plasma.

A tuning capacitor 402 is disposed at the entry of the cavity. A button 401 with a fine thread allows adjustment of the value of the capacitor 402 thus making it possible to tune the reactive part of the circuit. An equivalent circuit diagram of the cavity and of its coupling is represented in FIG. 6 in which C represents the capacitor with variable tuning, C$_c$ and L$_c$ respectively represent the capacitor and the self-inductance of the cavity, Z$_p$ represents the impedance of the plasma and G represents the microwave generator.

Four slots 406 furthermore make it possible to cause the length of the gap 404 to vary, which modifies the impedance Z$_e$ of the equivalent circuit.

A wave trap 405 is also provided in order to limit energy losses towards the outside.

The discharge tube is cooled via a compressed air passage 407.

Example

The effect of the presence of O$_2$ at flow rates which are variable with respect to the flow rate of the plasma-producing gas N$_2$ on the deposition of tetramethyldisiloxane (TMDS) was studied by collecting the polymer on an anhydrous zinc plate and a humid zinc plate (0.5% RH).

The presumed role of the coagent gas seems to be able to be explained by the influence which it has on the energy carriers of the plasma:

| | | |
|---|---|---|
| N$_2$(A$^3\Sigma_u^+$) + N($^4$S) | → | N$_2$(X$^1\Sigma_g^+$)$_v$ + N($^4$S) | (1) |
| N($^4$S) + N($^4$S) | → | N$_2$(A$^3\Sigma_u^+$) + h$\nu$ | (2) |
| N($^4$S) + O$_2$($^3\Sigma_g^-$) | → | NO(X$^2$Π) + O($^3\rho$[sic]) | (3) |
| N($^4$S) + O($^3\rho$[sic]) | → | NO(X$^2$Π) | (4) |

Reactions (1) and (2) are competitive and (2) is predominant.

Reaction (2) is more energetic than (1).

The inhibition of N$_2$(A$^3\Sigma_u^+$) by O$_2$ unbalances (2) promoting the recombining of N($^4$S) and makes it possible to obtain a more energetic plasma. The increase in the degree of coagent gas tends to deactivate N($^4$S) (equations (3) and (4)) and therefore to decrease the concentration of the energy carriers in the plasma.

An energy maximum may be obtained in equilibrium between the inhibition of N$_2$(A$^3\Sigma_u^+$) and the deactivation of N($^4$S).

TABLE I

The table gives the various values of deposition rate obtained according to the preferred embodiment:

| O$_2$ flow rate slpm | % O$_2$ % | Pressure mB | Dep. rate a) mg/cm$^2$/h | Dep. rate b) mg/cm$^2$/h |
|---|---|---|---|---|
| 0.000 | 0 | 4.0 | 2.90 | 2.92 |
| 0.015 | 1 | 4.0 | 4.82 | 4.90 |
| 0.030 | 2 | 4.0 | 6.70 | 7.65 |
| 0.045 | 3 | 4.1 | 7.20 | 9.15 |
| 0.060 | 4 | 4.1 | 7.88 | 10.02 |
| 0.075 | 5 | 4.2 | 7.71 | 10.65 |
| 0.090 | 6 | 4.2 | 7.50 | 12.10 |
| 0.105 | 7 | 4.2 | 6.90 | 12.40 |
| 0.120 | 8 | 4.4 | 6.10 | 11.30 |
| 0.135 | 9 | 4.4 | 4.80 | 9.10 |
| 0.150 | 10 | 4.4 | 4.15 | 5.80 |

Figure 7:
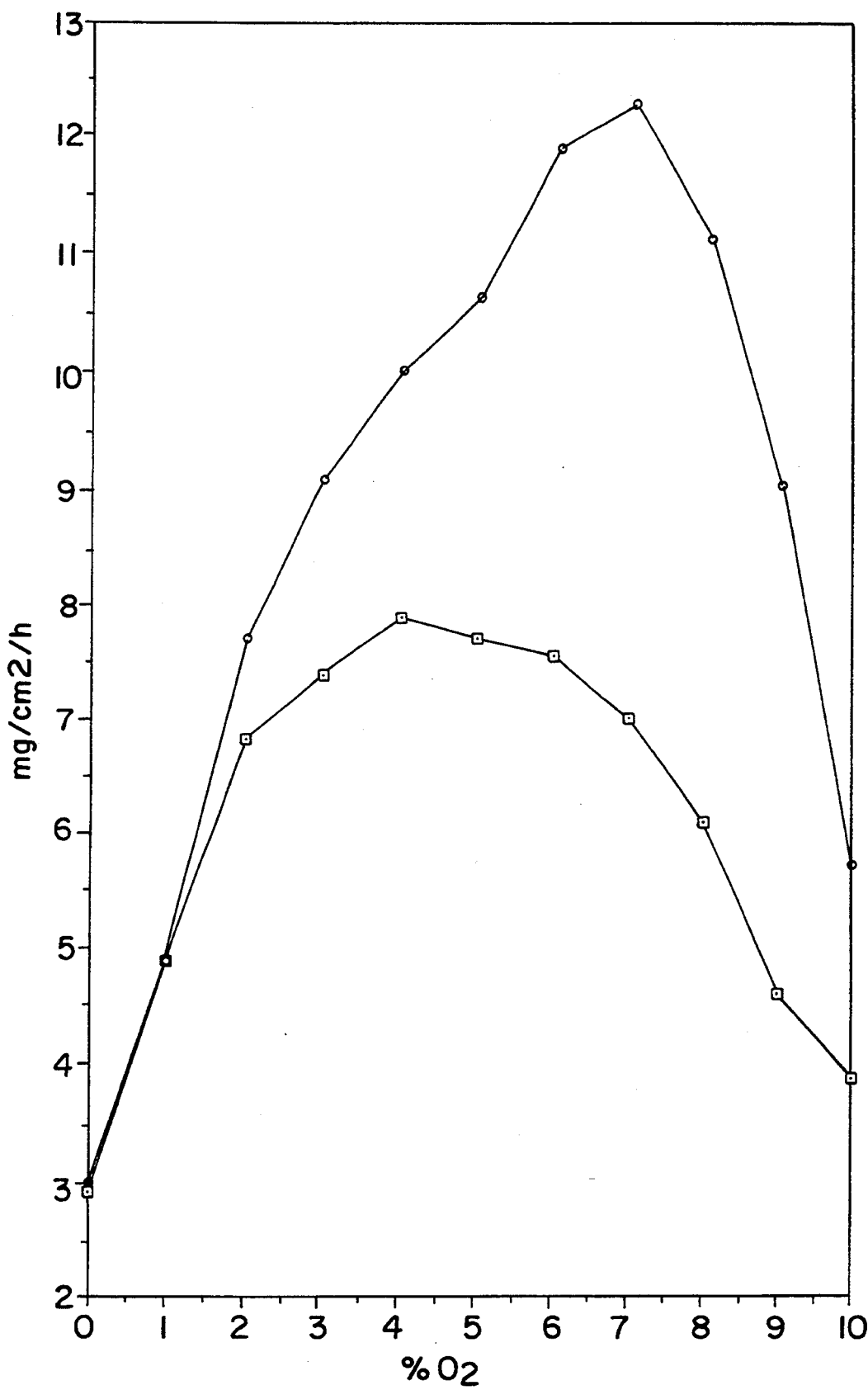
FIG. 7 represents values of deposition rate as a function of increasing oxygen contents in the nitrogen used as the plasma-producing gas in the presence and in the absence of water vapor.

F = 433 MHz  Pabs = 360 W
Plasma-producing gas = N$_2$  N$_2$ flow rate = 1.5 slpm
Monomer gas = tetramethyldisiloxane (TMDS)  flow rate = 1.5 cc/h
Coagent gas = O$_2$ a) Polymer collected on an anhydrous zinc plate
b) Polymer collected on a 0.5% RH zinc plate These experimental results are reproduced in FIG. 7. The upper curve (black circle) is the one obtained on a humid zinc plate. The lower curve (white square) is obtained in the case of an anhydrous zinc plate.

We claim:

1. A process for forming a coating on a surface of a textile fiber, comprising subjecting the fiber surface to first and second process phases while passing the fiber through a reaction medium comprising a cold flowing plasma containing an active species, the first phase including treating the fiber surface in order to increase its adhesive properties, and the second phase including introducing a polymerizable material comprising at least one of a prepolymer and a monomer into the cold flowing plasma in the presence of the fiber under conditions sufficient to induce the formation of a polymerized coating on the fiber surface, polymerization being induced by the active species.

2. A process according to claim 1, wherein the first phase is conducted in a delocalized discharge regime of the cold flowing plasma.

3. A process according to claim 2, wherein the second phase is conducted in a post-discharge regime of the cold flowing plasma.

4. A process according to claim 1, wherein the second phase is conducted in a post-discharge regime of the cold flowing plasma.

5. A process according to claim 1, wherein the cold flowing plasma is obtained by microwave discharge.

6. A process according to claim 5, wherein the microwave discharge is produced at a frequency of one of 433 MHz, 915 MHz and 2450 MHz.

7. A process according to claim 1, wherein the cold flowing plasma is obtained by discharge in a plasma-producing nitrogen gas.

8. A process according to claim 7, wherein the nitrogen gas is doped.

9. A process according to claim 7, further comprising the step of introducing a polymerization co-factor upstream from the introduction of the polymerizable material, the co-factor comprising at least one of oxygen and water vapor.

10. A process according to claim 7, further comprising the step of introducing a polymerization co-factor substantially simultaneously with the introduction of the polymerizable material, the co-factor comprising at least one of oxygen and water vapor.

11. A process according to claim 1, wherein the textile fiber comprises a yarn and the process is performed continuously on the yarn.

12. A process according to claim 1, wherein the textile fiber comprises an organic polymer.

13. A process according to claim 1, wherein the textile fiber is at least one member selected from the group consisting of polyamides, polypropylenes and polyesters.

14. A process according to claim 1, wherein the polymerizable material is a silicon derivative.

15. A process according to claim 14, wherein the silicon derivative is a siloxane.

16. A process according to claim 15, wherein the siloxane has the formula

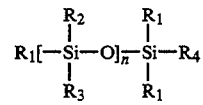

wherein
$R_1$ and $R_4$ are aliphatic groups,
$R_2$ is a methyl, hydroxyl, ethyl or carboxyl group,
$R_3$ is a methyl group and
n is between 1 and 40.

17. A process according to claim 16, wherein the siloxane has the formula

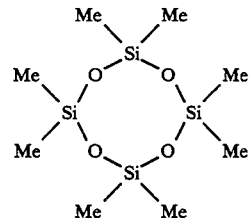

wherein Me is a methyl radical.

18. A process according to claim 14, wherein the silicon derivative is a silazane.

19. A process for forming a coating on a surface of a textile fiber, comprising subjecting the fiber surface to first and second process phases while passing the fiber through a reaction medium comprising a cold flowing plasma obtained by microwave discharge in a plasma-producing nitrogen gas, the plasma including a nitrogen-containing active species, the first phase including treating the fiber surface in a delocalized discharged regime of the cold flowing plasma in order to increase the adhesive properties of the fiber surface, and the second phase including introducing a polymerizable material comprising at least one of a prepolymer and a monomer into a post-discharge regime of the cold flowing plasma in the presence of the fiber under conditions sufficient to induce the formation of a polymerized coating on the fiber surface, polymerization being induced by the nitrogen-containing active species.

20. A process according to claim 19, wherein the nitrogen gas is doped.

* * * * *